United States Patent [19]

Cederström

[11] Patent Number: 5,198,066

[45] Date of Patent: Mar. 30, 1993

[54] MOUNTING OF THE LIDS OF CAPSULES FOR SOLID STATE INTEGRATED CIRCUITS

[76] Inventor: Jan Cederström, Box 52, S-133 01 Saltsjöbaden, Sweden

[21] Appl. No.: 781,145

[22] PCT Filed: Jun. 19, 1990

[86] PCT No.: PCT/SE90/00434

§ 371 Date: Dec. 27, 1991

§ 102(e) Date: Dec. 27, 1991

[87] PCT Pub. No.: WO91/01045

PCT Pub. Date: Jan. 24, 1991

[30] Foreign Application Priority Data

Jul. 7, 1989 [SE] Sweden .................... 8902471

[51] Int. Cl.$^5$ ............................................ B32B 31/00
[52] U.S. Cl. .................................. 156/538; 156/556; 228/212; 228/237; 228/243; 264/230
[58] Field of Search ................. 156/83, 499, 538, 556, 156/49; 264/230; 228/212, 237, 243

[56] References Cited

U.S. PATENT DOCUMENTS

| | | |
|---|---|---|
| 4,126,758 | 11/1978 | Krumme . |
| 4,384,906 | 5/1983 | Molinari et al. ................ 156/49 X |
| 4,661,886 | 4/1987 | Nelson et al. . |
| 4,767,589 | 8/1988 | Takaoka et al. ................ 156/49 X |
| 4,950,258 | 8/1990 | Kawai et al. ................ 264/230 X |

Primary Examiner—David A. Simmons
Assistant Examiner—James J. Engel, Jr.
Attorney, Agent, or Firm—Burns, Doane, Swecker & Mathis

[57] ABSTRACT

The device is intended for application by oven soldering of covers on semiconductor capsules (1) when they are still held in a fixture (2) used in a previous manufacturing step. A cover portion (3), which is applied, has a centering means (30) for centering a semiconductor capsule (1) in relation to a cover (4) hanging in a permanent magnet in the cover portion (3). After the cover portion is in place and during heating, a pusher (6) of memory metal will after changing shape press the cover (4) into place on the capsule (1) where it is soldered in place.

9 Claims, 4 Drawing Sheets

MOUNTING OF THE LIDS OF CAPSULES FOR SOLID STATE INTEGRATED CIRCUITS

The invention relates to a device for mounting covers of ferromagnetic material on capsules, substrates and hybrid modules for semiconductor components, whereby a capsule cover is applied over an opening in a capsule with a conductor-bonded circuit mounted therein, there being between the capsule and the cover a fusible film of soldering metal or other fusible means, the cover being soldered to the capsule by the capsule provided with the cover being heated in an oven often in a protective gas atmosphere.

In mounting a finished circuit in its capsule, bonding is accomplished via access wires to the capsule's electrical conductor (legs or contacts designed for surface mounting) by special robot machines. During this operation, which is one on the assembly line principle, the capsules which are still not provided with covers are placed in special fixtures from which they are automatically retrieved for the bonding work and returned thereto. After this coupling they are taken up by hand, a cover provided with solder in the form of a foil is placed thereon, the cover is held in place by a clamp and the capsules are advanced on a conveyor belt through an oven with a protective atmosphere (nitrogen, helium or argon), where they are heated so that the cover is soldered securely in place, as a rule less than about 360° C. In certain cases, instead of metal solder, glass or similar fusible material can be used where the melting point can be higher.

This method has several disadvantages. On the one hand, the automatic chain is broken, and on the other hand a repetitive manual step is introduced of the type requiring attention without stimulation, which results in faulty articles. In view of the fact that the testing of both the connections and the function of the circuit itself is often done automatically in connection with the automated bonding, these faults will affect otherwise perfect and properly connected, and therefore potentially expensive, circuits. Furthermore the clamps used have a limited life due to the high temperatures.

It is therefore a purpose of the present invention to provide automatic cover application as well, thus reducing both the number of rejects and time consumed. Another purpose is to enable the electronic semiconductor circuits to be covered in an inert atmosphere. A third purpose is to make use of the fact that the open but otherwise completed circuits exit from the covering station lying in fixtures, during additional treatment steps such as marking.

The advantages and characteristics of the invention are achieved in a device of the type described by way of introduction which has those characteristics disclosed in the attached claim 1.

The invention is thus based on the ferromagnetic capsule covers being held by magnets and being relatively accurately centered over the capsules. The capsules lie with a certain amount of lateral play in the fixtures and when the cover portion is mounted by means of magnets, the capsules will be centered under the cover, within proper tolerances. The fixtures with the cover portions applied thereto then proceed into an oven via a slotted opening. When working with a protective gas, there is a certain amount of overpressure in the oven, and the fixtures provided with numerous openings will therefore be cleared of air in the opening, and this also applies to the circuit capsules themselves which have not yet been sealed by means of the covers. When the fixtures with their cover portions have arrived into the oven, the pushers are heated and assume another shape, and they press the covers against the capsules with the desired pressure. As the temperature increases further, the intermediate fusible layer melts and the covers are soldered or fused in place, and the fixture exits thereafter from the oven. Marking and other such operations can now be performed on the capsules in their fixtures after the cover portions have been removed.

In order to accomplish the extension and retraction of the cover holders as required, it is possible to use either a memory metal or a bimetal. An appropriate memory metal is an NiTi-alloy (50% of each) with a conversion temperature of almost 100° C. Such materials can be purchased from for example Special Metals Corp., New Haven; Krupp Forschungslaboratorium, Essen; or SISRI, Shanghai. Iron based memory metals also appear promising, especially due to their ability to withstand high temperatures. A helical means, which is suitable, can be made by winding onto a suitable fixture, and being fixed in its position whereafter it is heated to about 500° C. to fix the high temperature configuration, followed after cooling by etching to eliminate the oxide layer. A helix so treated, with a steep pitch for example, can be compressed and thus assume another shape but expand to its high temperature form at the conversion temperature characteristic for the material. Such a memory metal does not by itself assume any particular low temperature shape. Rather it must be deformed each time. It is however possible by repeated heating, cooling and deformation in the cold state ("training") of certain memory metals to obtain a means which assumes two distinct shapes, at different temperatures. The first mentioned simpler type is however preferable at present, it being relatively simple to compress the pusher as the cover portion is loaded with a new cover.

In many cases it is instead more suitable to use a bimetallic means, preferably consisting of two plates welded together having different coefficients of thermal expansion. One advantage of the bimetallic means is that it functions at higher temperatures. But a disadvantage is that the price is higher especially as compared to iron based memory metals.

A particularly advantageous pusher mechanism using a memory metal comprises a triangular construction with two relatively long sides and a short side, the first long side consisting of a relatively thin memory metal portion, for example a wire, and the second long side can be resiliently pulled by the first long side so that the triangle is deformed as the first long side by a temperature change becomes shorter, the means returning to its original shape as the temperature change is reversed. Resilience can be achieved by making the second long side elastically bendable or by making its connection to the short side hinged and spring mounted.

The application of the cover by heating the pusher can be effected by the pusher exerting a force on the cover and pressing it against the force of the magnet down across the gap. Presently it is however preferred to allow the cover to remain in contact with the magnet which is movably mounted, suspended in a tensile spring or the like, the pusher acting on the magnet against the force of the tensile spring to complete the desired movement of the same with the cover thereon. When the soldering has been completed, the magnet returns by the force of the tensile spring to its original position and leaves the cover soldered to the capsule.

In this preferred embodiment, the spring upon its return will give the pusher its low temperature shape, and it therefore does not need to be "trained". In the first mentioned embodiment, the low temperature shape can be "trained" or the pusher can be shaped upon the application of the cover to the magnet.

It is suitable that the magnetism of the magnet be so configured that there are one or more pairs of poles close to each other. It is then possible to pick up covers one by one from a stack arranged in some fixture without the risk of more than one of these thin covers being picked up by the magnet.

The invention will now be described with reference to non-limiting examples shown in the drawings.

FIGS. 8A–D show the various functional faces in one embodiment.

Figure 9A:
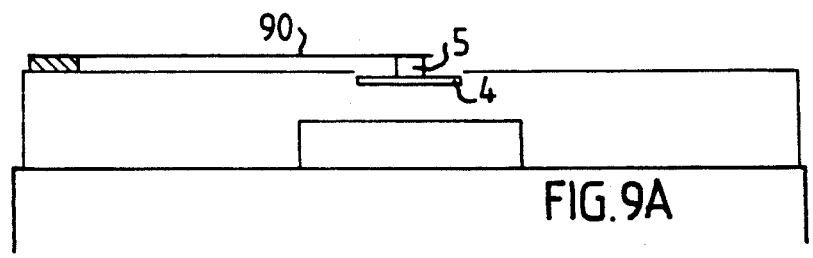
Figure 9B:
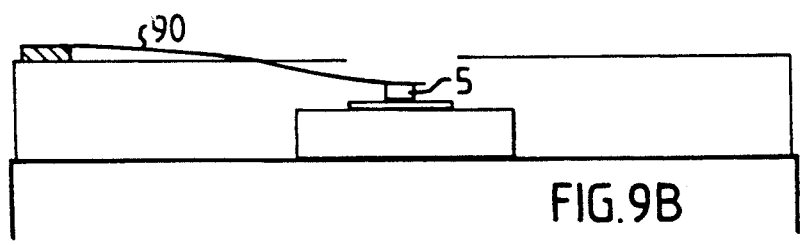

FIGS. 9A–B show schematically a corresponding example with a bimetallic means.

Figure 10A:
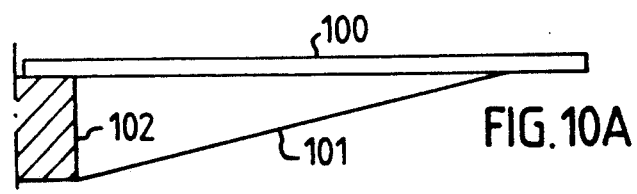
Figure 10B:
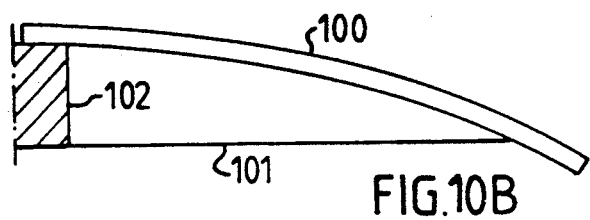

FIGS. 10A–B show a further example with a memory metal.

As can be seen in the figures, a schematically shown semiconductor capsule 1 is received in a fixture 2 which is made of stamped and bent sheet metal with fingers 20 forming the receptacles in which the semiconductor capsules are held. These fixtures are previously known and of the type used in mass production of capsuled chips, which are picked up from the fixtures by robots for bonding of access wires, testing etc. and are finished except for the final step of sealing with a cover.

According to the invention, one now exploits the fact that the capsules lie in the fixtures in the gap between the folded up fingers 20. The covers to be soldered on are of known type and of magnetic material and have a thickness of about 0.3 mm and the manufacturing tolerance of about 1 μm. They are provided on one side with provisionally applied sheets of thin tin alloy ending at the edges, intended for being soldered over an opening in the almost finished semiconductor capsule. In certain cases fusible glass is used instead.

Figure 1:
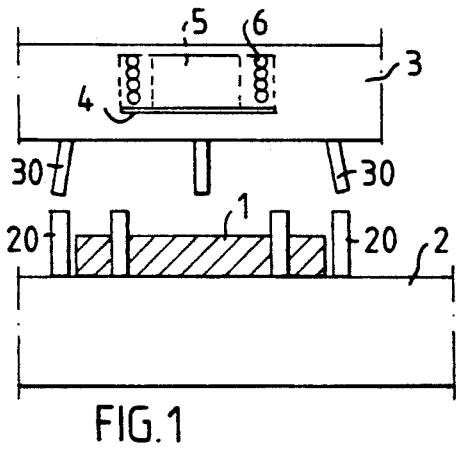
FIG. 1 shows schematically a partial view of a semiconductor capsule and the principle for centering a cover.
Figure 2:
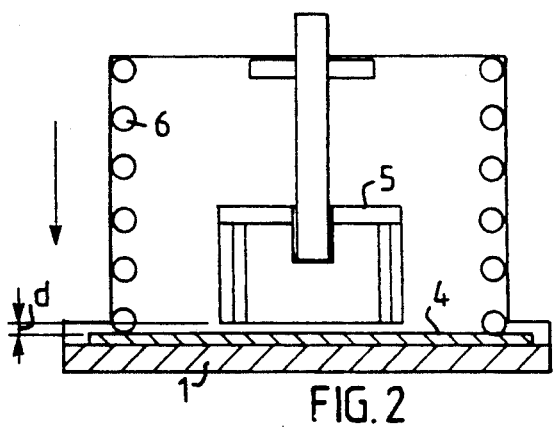
FIG. 2 shows schematically in another embodiment a cover applied with its application apparatus.

FIGS. 1 and 2 reveal how the application of the cover 4 is arranged according to the invention. As can be seen in FIG. 1, the schematically shown capsule 1 is without a cover between the fingers 20 in the fixture 2. In a cover portion, in a well-like space there is a permanent magnet 5 holding the cover 4. To one side thereof there are adjustment means 30 arranged in a wedge-shape, which are carefully placed in relation to the well-like space determining the lateral position of the cover 4. It is evident from FIG. 1 that as the cover portion 3 is lowered towards the fixture 2, the loosely held capsule 1 will be centered by adjustment means or fingers 30 arranged as a wedge or funnel. Around the magnet 5 mounted in the cover portion there is a pusher 6 in the form of a helical spring, which when heated extends and presses the cover 4 from the magnet 5 and against the capsule 1. This is shown in a somewhat altered form in FIG. 2, where the magnet 5 has been made smaller and different and is fixed in the cover portion by means of a stem and where the gap d between the cover 4 and the magnet 5 corresponds to the previously described gap between the capsule and the cover.

Figure 3:
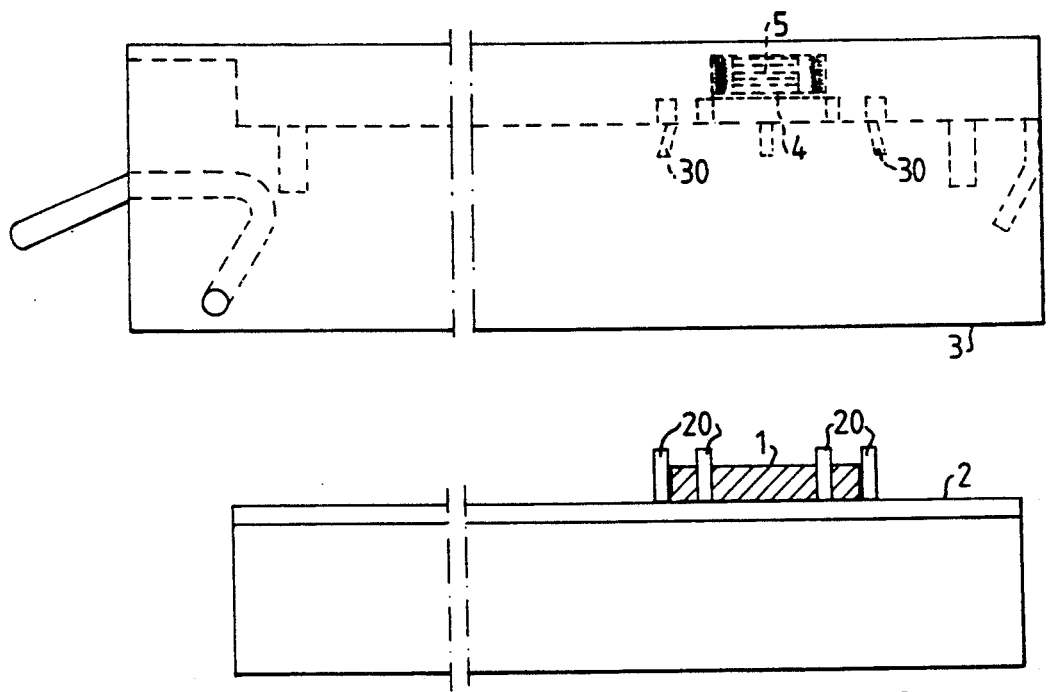
FIG. 3 shows a fixture and a cover portion prior to application.
Figure 4:
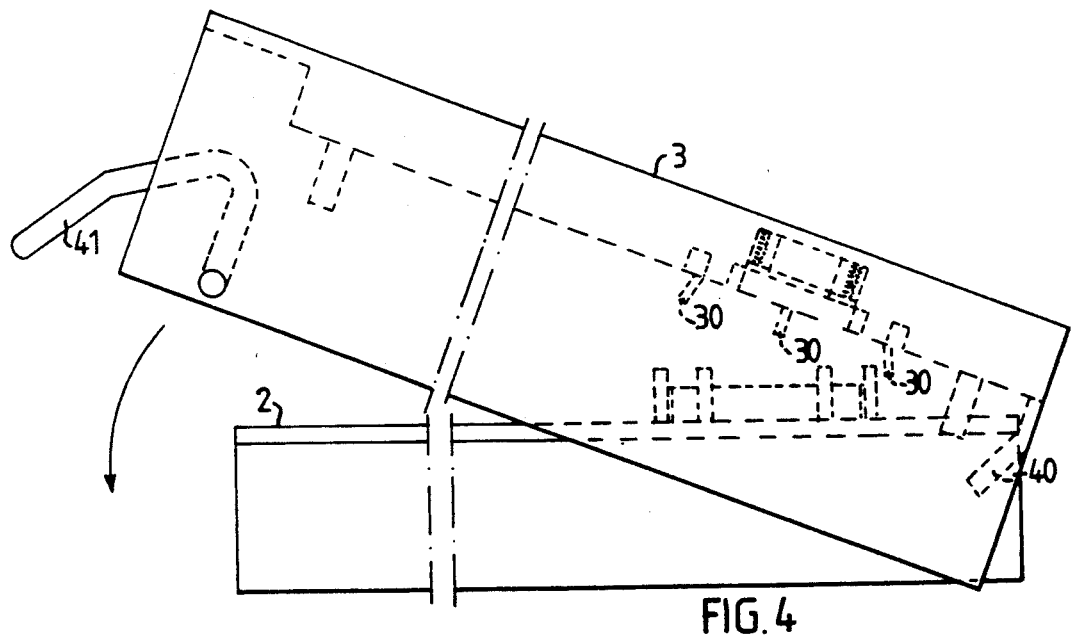
FIG. 4 shows the application of the cover portion according to FIG. 3.

Although not directly evident from the Figures, each fixture contains a number, for example 4 or 6, semiconductor capsules in individual receptacles, distributed along the fixture. The cover portion must therefore be complementary with the same number of magnetic cover holders etc. More than one unit has however not been shown in the Figures, FIG. 3 showing a shortened fixture 2 together with a shortened cover portion. The fixture has in a section perpendicular to the plane of the Figure an essentially upside down U-shape (not shown) and is made of sheet metal. FIG. 4 shows how the cover portion is applied by hooking the element 40 against one end of the fixture 2. The pivot movement indicated by the arrow in FIG. 4 is then completed to the position shown in FIG. 5 and the locking means 41 in the cover portion 3 is turned to lock against the underside of the fixture. During this movement, the centering means 30 shown in FIG. 1 will center the semiconductor capsule 1 directly in front of the cover 4 held by the magnet 5.

Figure 5:
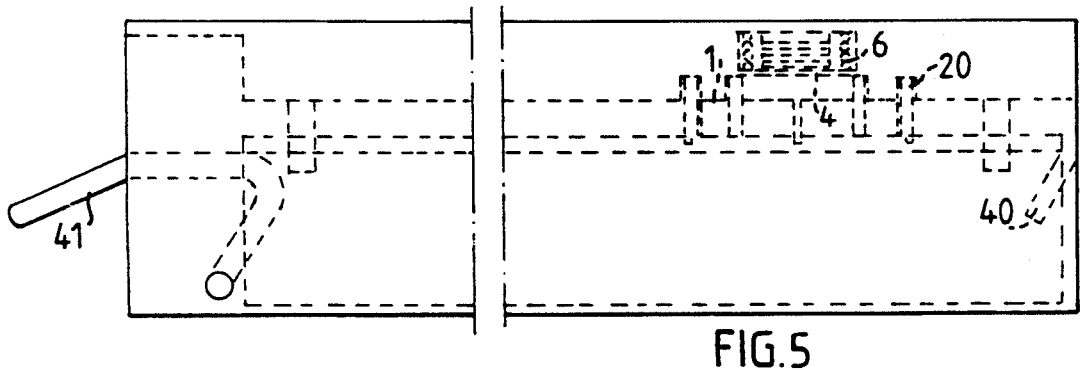
FIGS. 5 and 6 show the fixture with the cover portion applied, prior to and after reaching the temperature for activating the pusher.

The closed unit shown in FIG. 5 can now be inserted into an oven with an inert atmosphere, and the gap between the capsule 1 and the cover 4 makes is possible to replace the atmosphere in the cavity (not shown) in the capsule. It is also possible to allow the closing of the cover to be done in a vacuum with evacuation being effected as well through the gap between the cover 4 and the capsule 1. This gap, of dimension d in FIG. 2, can be for example about 1 mm. A particular advantage with the invention is that one is able to control the atmosphere inside the finished capsule. In certain applications it is advantageous to use an inert gas such as helium which has a good heat transfer capacity.

Figure 6:
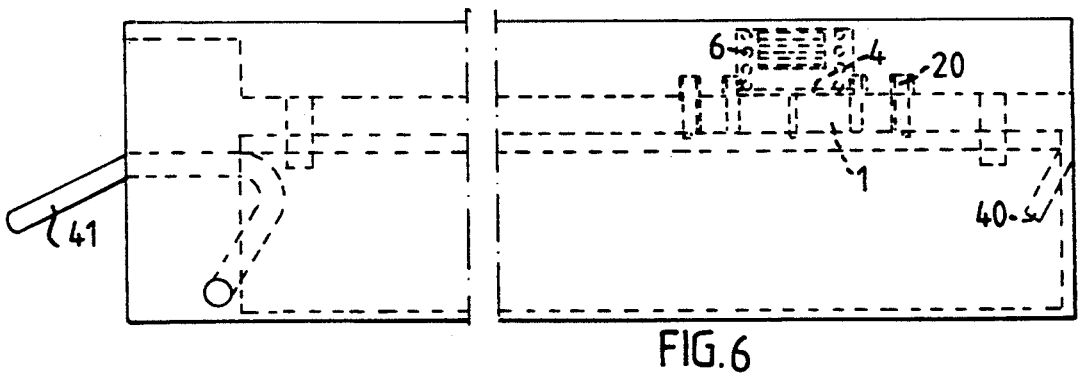

During heating, the pusher 6 will change its shape and assume its high temperature shape, whereby the cover 4 is pressed down against the capsule 1 to the position shown in FIG. 6, whereafter, due to additional rise in temperature, the intermediate thin layer of tin (not shown) will wet both the cover 4 and the capsule 1 so that the capsule will become tightly sealed. Even during removal from the oven the cooling, the cover will be pressed down, until the cover portion 3 is removed from the fixture 2. The semiconductor capsules will thereafter remain in the fixture, making possible easy printing of type codes, the manufacture's name etc, before the finished components are removed from the fixture.

Figure 7:
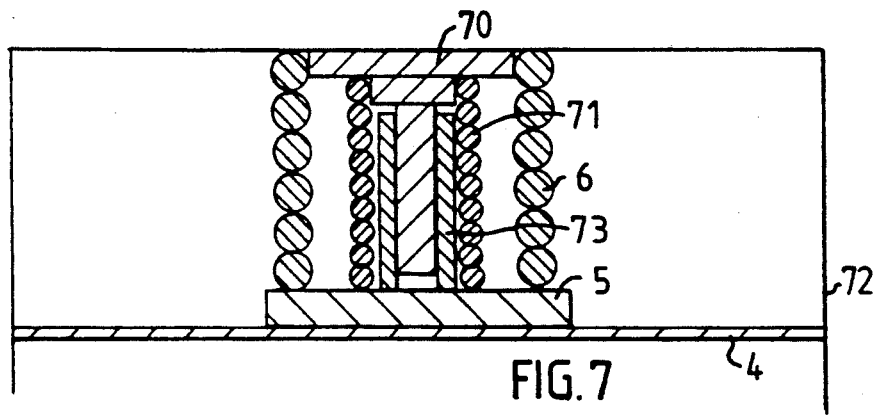
FIG. 7 shows a preferred embodiment with a movable magnet.

In accordance with an improved embodiment, shown in FIG. 7, the magnets in the cover portion are made movable, and their position is changed by the changing shape in a memory metal means. In this case, the magnet 5 is guided telescopically. A tube 73 fixed to the magnet 5 is slipped over a pillar device 70, which also functions as a holder for a tensile spring 71, which tends to hold the magnet 5 in its lifted up position. A memory metal spring 6 will extend upon heating and, against the force of the helical spring 71 press the magnet 5 with its cover 4 held thereon down towards a semiconductor capsule (not shown). One advantage of this design is that the memory metal spring 6 does not need to be "trained" to a predetermined low temperature shape, since the return is guaranteed by the tensile spring 71. It should be noted that the magnet 5 in FIG. 7 with the associated means is mounted in a well-like space with walls 72, which determine the position of the cover 4 with sufficient precision.

Figure 8A:
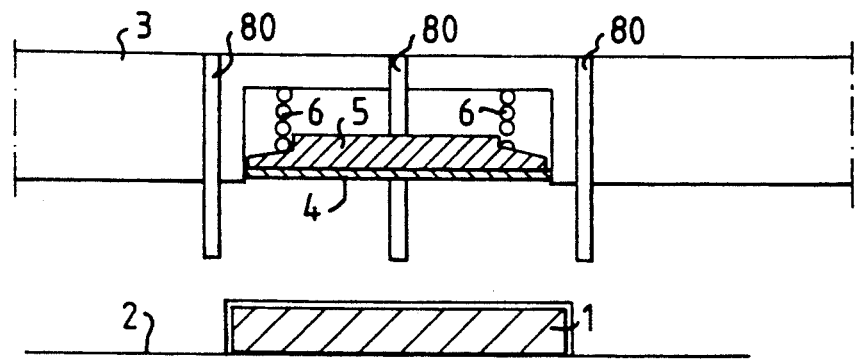
Figure 8B:
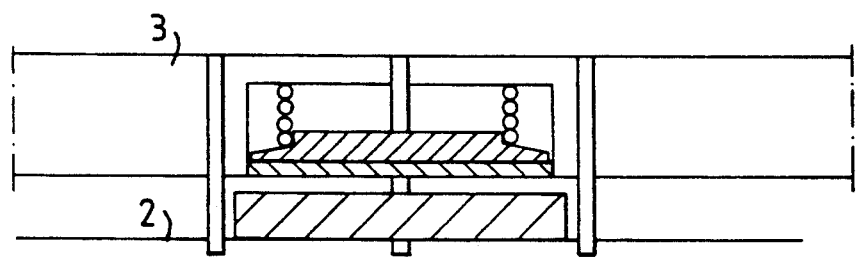
Figure 8C:
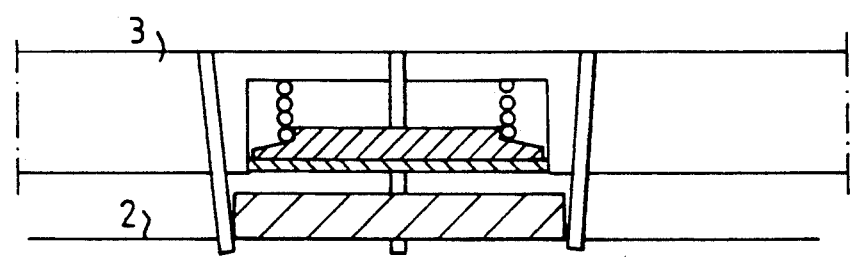
Figure 8D:
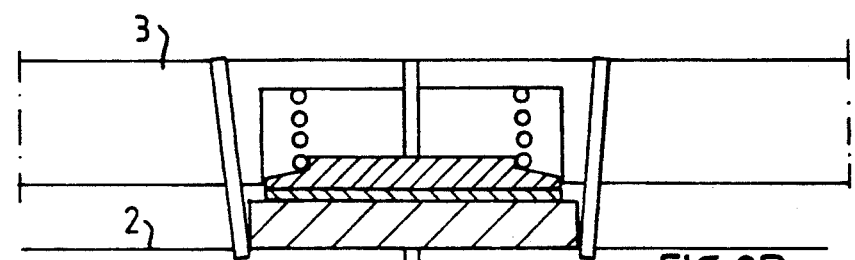

FIGS. 8A-D show another preferred example, illustrating a device which satisfactorily guarantees that the semiconductor capsules will be properly settled in their spaces in the lower portion 2. The semiconductor capsule 1 lies in a receptacle defined by means (not shown) which can consist of holes into which downwardly directed connecting legs are inserted with play, or, in capsules which are intended for surface mounting and thus lack legs, in a receptacle defined by upperly bent sheet metal fingers. The upper portion 3 has around the location for the cover portion 4 memory metal means 80 for centering. These are shown as rods, one end of which is fixed to the cover portion 4. FIG. 8B shows the configuration after application of the cover portion at room temperature. Upon heating the rods will, as shown in FIG. 8C, bend inwards towards the capsule. This occurs suitably at for example 60° C. A further rising temperature, to for example 90° C., results in the memory metal spring 6 lowering the magnet 5 with the cover 4 thereon into contact with the capsule 1, as shown in FIG. 8D. By thus using memory metals with different conversion temperatures, the effect is achieved that the capsule is first centered relative to the cover, which is then applied, this being done in sequence after insertion in the oven.

FIGS. 9A and 9B show schematically the use of a bimetal in place of a memory metal. A bimetallic flat 90 is straight at room temperature and is fixed in one end to the cover portion while its free end carries a magnet 5, which can hold a cover. As is seen in FIG. 9B, the bimetalic means 90 will, upon heating, change shape and move the magnet 5 with the cover 4 held thereon towards a semiconductor capsule for soldering.

FIGS. 10A and 10B show an alternative embodiment of the displacement mechanism, based on memory metal. An elastic flat 100 and a wire 101 of memory metal form together a support which can be included in a cover portion according to the invention, an elongated triangular configuration. The memory metal wire will when heated contract, and the triangle shape will thus be deformed as the elastic metal flat 101 is deflected downwards. A magnet (not shown) can be fixed to its end in accordance with the invention. During cooling this deformation is reversed and the spring force means that the memory metal wire need not be "trained" into its low temperature shape.

The essential principles of the invention have thus been described. In view of the fact that there are many types of semiconductor capsules, with different leg configurations and connecting electrodes, the used fixtures known per se must be adapted thereto and the cover portion must fit thereon. The materials used must of course be able to withstand heat, and this also applies to the magnets, which however does not present any difficult problem to the person skilled in the art. The magnets can be in one piece as in FIG. 1 or can be attached as in FIG. 2. They can also be divided as for example in the form of a rod magnet surrounded at some distance therefrom by a ferromagnetic, possibly also permanently magnetic, tube, providing an annular small gap between the tube and the rod, with a conducting iron washer being arranged facing the pole surface of the composite magnet. Such a configuration means that the magnetic field will be concentrated to the annular gap in the pole surface, making it possible to pick up a single cover from a stack, without risk of more than one cover being picked up.

Without going into particular detail here, it is obvious to the person skilled in the art that the "loading" of the cover portion with new covers and the possible recompression of the memory metal spring can be done in one step by suitable means. Although the memory metal pusher which is shown as a helical spring shape, it is also obvious that one could work with other shapes, e.g. a leaf spring of memory metal or bimetal, without deviating from the general inventive idea as defined in the following patent claims.

I claim:

1. Device for mounting capsule covers of ferromagnetic material on capsules for semiconductor components, whereby a capsule cover (4) is applied over an opening in a capsule (1) with a conductor-bonded circuit mounted therein, there being between the capsule and the cover a fusible film of soldering metal or other fusible means, the cover being soldered to the capsule by the capsule provided with the cover being heated in a protective gas atmosphere in an oven, characterized by a lower portion (2) for placing the open capsules in predetermined positions and a cover portion (3) intended for application onto the lower portion, the cover portion having firstly holder means for mounting the capsule covers, arranged so that, as the cover portion is applied, they are centered on the capsules placed in the lower portion, said holding means comprising magnets, and secondly releasing means comprising means of memory metal or bimetal arranged through shape-change to act on the capsule covers mounted in the cover portion to move upon heating from a first position where a gap is created between the capsule and the capsule cover, to a second position of contact between the capsule and the capsule cover.

2. Device according to claim 1, characterized in that the magnets are suspended on tensile springs, which at room temperature keep each magnet with its cover thereon at the gap distance, a pusher made of memory metal or bimetal being arranged upon heating to press the magnet with the cover thereon against the force of the tensile spring towards the opening in the semiconductor capsule.

3. Device according to claim 1, characterized in that a pusher of memory metal or bimetal is disposed upon heating to push directly against a portion of the capsule cover (4) laid against the pole surface of the magnet and which does not cover the pole surface in order to move, during its release from the pole surface, the capsule cover from its position held by the magnet across the gap distance (d) to contact with and covering of the opening in the semiconductor capsule.

4. Device according to claim 1, characterized in that the release means (6) are in the form of wire helical springs, one end of which is fixed to the cover portion and which surround each magnet.

5. Device according to claim 1 or 2, characterized in that the magnet is magnetized with magneticly opposite poles lying close to each other at the pole surface (FIG. 2).

6. Device according to claim 5, characterized in that the magnet (5) is composed of a cylindrical rod magnet and a tube slipped thereon of ferromagnetic, possibly permanently magnetic and relative to the rod magnet oppositely magnetized material, and a washer of ferromagnetic material joining one end of the tube and the rod magnet.

7. Device according to claim 1, characterized by a centering means mounted in the cover portion, disposed to center the capsules laid with play in their respective position relative to the covers held in the holder means, which means are made of memory metal or bimetal, which when not heated leave the semiconductor capsule (1) lying freely in its position but when heated change shape and move individually from different direction towards the semiconductor capsule to laterally push the semiconductor capsule until all of the means make mechanical contact with the same and center it.

8. Device according to claim 7, characterized in that said means are elongated, extended essentially vertically and are fixed at their upper portions to the cover portion.

9. Device according to claim 1, characterized in that the release means comprise an elongated means (101) of memory metal and a second elongated means (100), the memory metal means (101) having its one end connected to the second elongated means thereby forming an acute angle, the memory metal means at its other end and the second means (100), which is elastic, being fixed to a support (102) so that the two means form the long legs in an essentially isosceles, sharply pointed triangle.

* * * * *